United States Patent
Tauzin et al.

(10) Patent No.: US 8,546,238 B2
(45) Date of Patent: Oct. 1, 2013

(54) METHOD FOR TRANSFERRING AT LEAST ONE MICRO-TECHNOLOGICAL LAYER

(75) Inventors: Aurelie Tauzin, Saint-Egreve (FR); Anne-Sophie Stragier, Grenoble (FR)

(73) Assignee: Commissariat a l'Energie Atomique et aux Energies, Paris (FR)

( * ) Notice: Subject to any disclaimer, the term of this patent is extended or adjusted under 35 U.S.C. 154(b) by 75 days.

(21) Appl. No.: 13/271,401

(22) Filed: Oct. 12, 2011

(65) Prior Publication Data
US 2012/0088351 A1 Apr. 12, 2012

Related U.S. Application Data

(63) Continuation of application No. PCT/FR2010/050767, filed on Apr. 21, 2010.

(30) Foreign Application Priority Data
Apr. 22, 2009 (FR) .................................. 09 52621

(51) Int. Cl.
*H01L 21/76* (2006.01)
(52) U.S. Cl.
USPC ........... 438/409; 438/407; 438/457; 438/458; 257/E21.57
(58) Field of Classification Search
USPC .................. 438/406–407, 409, 455, 457–458, 438/473–475; 257/E21.57
See application file for complete search history.

(56) References Cited

U.S. PATENT DOCUMENTS

| 7,084,046 B2 | 8/2006 | Mitani et al. |
|---|---|---|
| 2005/0082526 A1 | 4/2005 | Bedell et al. |
| 2010/0084746 A1* | 4/2010 | Akiyama et al. .............. 257/618 |

FOREIGN PATENT DOCUMENTS

| DE | 10223719 | 11/2003 |
|---|---|---|
| FR | 2855909 | 12/2004 |
| FR | 2940852 | 7/2010 |

* cited by examiner

*Primary Examiner* — Thanhha Pham
(74) *Attorney, Agent, or Firm* — Occhiuti Rohlicek & Tsao LLP

(57) ABSTRACT

A method for transferring a micro-technological layer includes preparing a substrate having a porous layer buried beneath a useful surface, forming an embrittled zone between it and the surface, bonding the substrate to a supporting substrate, causing detachment at the porous layer by mechanical stress to obtain a first substrate remnant, and a bare surfaced detached layer joined to the supporting substrate, performing technological steps on the bared surface of the detached layer, bonding the detached layer, by the surface to which the technological steps had been applied, to a second supporting substrate, causing detachment, at the embrittled zone, by heat treatment to obtain a detached layer remnant joined to the second supporting substrate, and the detached layer remnant joined to the first supporting substrate.

20 Claims, 1 Drawing Sheet

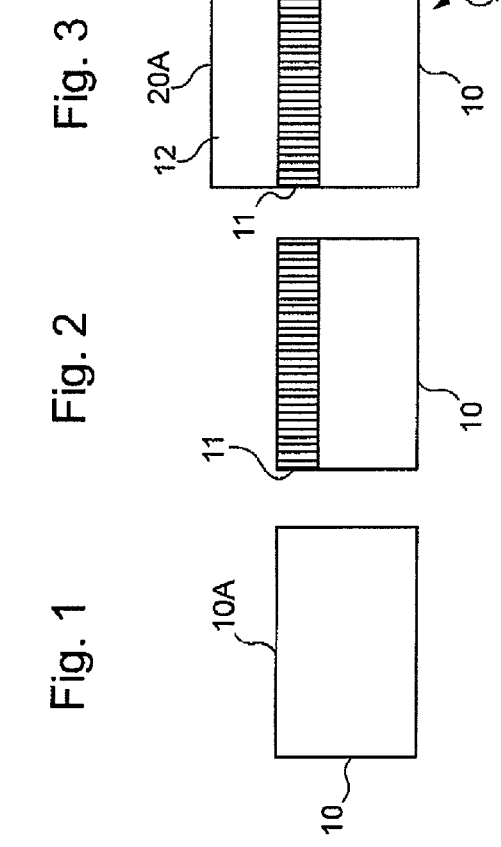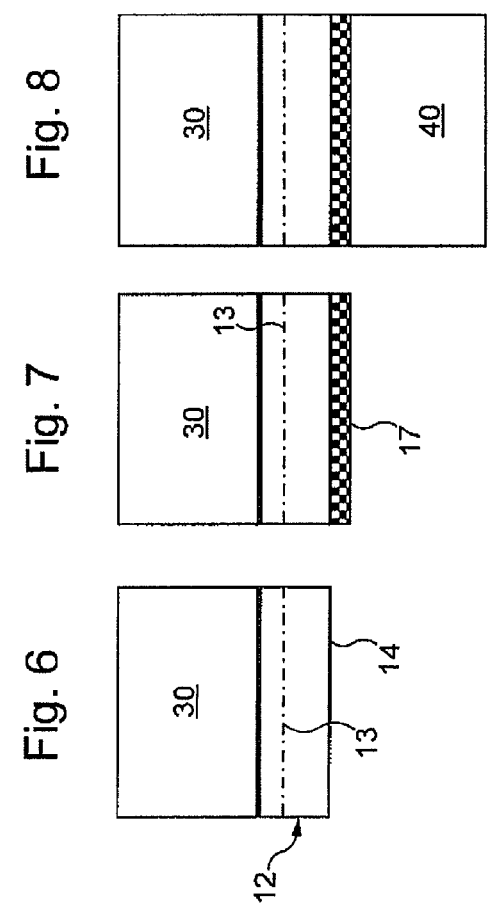

METHOD FOR TRANSFERRING AT LEAST ONE MICRO-TECHNOLOGICAL LAYER

CROSS REFERENCE TO RELATED APPLICATIONS

Under 35 USC 120, this application is a continuation of International Application No. PCT/FR2010/050767, filed Apr. 21, 2010. Under 35 USC 119, this application claims the benefit of the priority date of French Application No. 0952621, filed Apr. 22, 2009. Both of the foregoing applications are incorporated herein by reference.

FIELD OF DISCLOSURE

The invention generally pertains to the transfer of a layer from a first substrate to a second substrate and then, if necessary, to a third substrate etc. Various transfer techniques are known to date.

BACKGROUND

The Eltran® method describes a method for the transfer of thin films based on the formation of a fragile or brittle layer in a first substrate, technological steps applied to a surface portion of this substrate such as oxidation, epitaxial growth, making circuits etc., bonding the first embrittled substrate, by this surface portion, to a supporting substrate (by molecular or anode bonding or through adhesives) and splitting provoked at the layer, for example by the application of mechanical stresses. This brittle layer is in principle a porous layer, generally obtained by anodization of the material from a free face; this porous layer is therefore typically situated on the surface at the time of its formation. Inasmuch as this porous layer often needs to be buried at a non-zero depth from the surface, there are known ways of recrystallizing a part of this porous layer whose thickness, taken from the free surface, determines the depth of the residual porous layer. However, most frequently, the initial substrate is complemented by the epitaxial deposit of an additional layer (whence the name of the method, Eltran®, which is derived from "Epitaxial Layer Transfer). Usually, the constituent material of the initial substrate is silicon and the second substrate is electrically insulating, at least on the surface so that, after transfer of the layer of this initial substrate which surmount the porous layer, silicon-on-insulator (SOI) is obtained.

Another method of transfer is known as the "Smart Cut® method". This is a method for transferring thin films based on the implantation of gas ions, the bonding of the implanted substrate to a supporting substrate and the performance if necessary of technological steps and finally splitting brought about at the implanted zone, for example by heat treatment and/or the application of mechanical stresses.

It will easily be understood that when preparing micro-technological components, i.e. electronic, optical, mechanical and other components with dimensions smaller than one millimeter, or even one micron, it may be necessary to make several transfers so as to carry out technological steps at the different levels of depth needed. However, to prevent any imprecise control over the place at which the splitting takes place, it has appeared to be necessary until now to define steps of elaboration such that there is only one brittle zone, at a given point in time, within a given structure (i.e. a set of substrates or layers assembled by any appropriate means). It will be understood however that such a precaution runs counter to the need for productivity which is a primary concern in the industrial world.

SUMMARY

An object of the invention is a method for transferring micro-technological layers, enabling higher production speed and greater flexibility in the choice of the technological steps to be made.

To this end, the invention proposes a method for transferring at least one layer comprising steps for:
preparing a first substrate comprising a porous layer buried beneath a useful surface at a non-zero distance,
forming, by ion implantation, an embrittled zone between this porous layer and this useful surface,
bonding the first substrate to a supporting substrate,
causing a detachment at the porous layer, by the application of a mechanical stress, so as to obtain, firstly, a remnant of the first substrate and secondly a detached layer joined to the supporting substrate and comprising a bared surface,
performing technological steps on the bared surface of the detached layer,
bonding the detached layer, by the surface to which the technological steps had been applied, to a second supporting substrate,
causing a detachment, at the embrittled zone, by application of a heat treatment so as to obtain, firstly, a remnant of the detached layer that is joined to the second supporting substrate and secondly a remnant of this detached layer that is joined to the first supporting substrate.

The invention thus proposes a method for making a structure that can be dismantled comprising, at a given point in time, two buried brittle zones which enable a dual transfer of layers by controlled mechanical or thermal separation, with the possibility of performing certain technological steps between the two separations. It must be noted that these two buried zones are formed successively within a same unit. This is not only a bonding of two substrates, each of which has been preliminarily subjected to an embrittling treatment independently of the embrittling treatment of the other substrate.

It will be noted that the invention enables efficient control of the place of the splitting by the making, in an appropriate order, of brittle zones having characteristics that are sufficiently different so that, by application of differentiated stresses, it can be ensured that the splitting of these brittle zones occurs in a well-determined order compatible with high efficiency of the method of elaboration.

According to advantageous characteristics of the invention, which may possibly be combined:
the zone embrittled by implantation is at a distance from the useful surface of the first substrate that is greater than the distance between this embrittled zone and the porous layer, for example greater than twice this distance; an inverse ratio is possible; this enables the formation of both a thin layer and a thick layer (as understood in micro-technology),
the first substrate is prepared by anodization of an initial substrate so as to make it porous on the surface and then by epitaxial growth of a dense layer from this porous layer,
the porous layer is formed by at least two porous sub-layers having different porosity values,
the porous sub-layer with lower porosity is closer to the free surface than the other porous sub-layer,
the porous layer has a thickness of at least one micron, which enables efficient localizing of the mechanical energy at the time of the detachment, the layer between the porous layer and the free surface is made of a monocrystalline material; it is for example silicon, or germanium (or an Si—Ge alloy) or again GaAs, or other materials used in micro-technology, the layer between the porous layer and the free surface has a thickness of at least two microns, thus contributing to the obtaining, after the second detachment (at the embrittled zone), of two useful layers, the embrittled zone is formed by implantation of at least one gas species (in fact other options are possible, with especially an implantation of species causing the formation of precipitates that could be made liquid, when the detachment is desired), at least hydrogen is implanted; as a variant or additionally, at least helium is implanted, detachment is provoked at the porous layer by localized application of mechanical energy, the technological steps comprise the formation of at least one part of a micro-technological component; these are for example steps of low-temperature deposition, operations of slicing to delimit for example tabs or vignette, screen-printing etc, and more generally technological steps generating high mechanical stresses but not requiring high heat budgets (in terms of temperature and duration), detachment is provoked at the brittle zone by application of a heat treatment combined or not combined with an application of mechanical energy, the remnant of the first substrate is used as a first substrate during a new cycle for implementing the method, furthermore, technological steps are applied to each of the parts of the detached layer that are separated during the detachment at the embrittled zone; this therefore enables two microstructure-treatment processes to be pursued simultaneously, giving rise to higher productivity.

Objects, features and advantages of the invention shall emerge from the following description, given by way of a non-exhaustive, illustrative example, with reference to the appended drawings, of which:

BRIEF DESCRIPTION OF THE FIGURES

FIG. 1 is a schematic view of an initial substrate,

FIG. 2 is a schematic view of this substrate after the formation of a porous layer by anodization, FIG. 3 is a schematic view after deposition of a surface layer, FIG. 4 is a schematic view of this surface layer after embrittlement by ion implantation, FIG. 5 is a schematic view after joining to an intermediate substrate, by molecular bonding, FIG. 6 is a schematic view of the upper part of the unit of FIG. 5 after separation along the porous layer, FIG. 7 is a schematic view after formation of components on the bared surface by separation along the porous layer, FIG. 8 is a schematic view after joining to a final substrate along the bared face, and FIG. 9 is a schematic view of the unit formed in FIG. 8, after separation along the embrittled layer.

DETAILED DESCRIPTION

FIGS. 1 to 9 give a schematic view of the method of the invention.

The method begins (see FIG. 1) by the preparation, in any appropriate way, of an initial substrate 10 having a useful face 10A. This substrate may be in one piece or it may be formed on a support on which a working layer has been formed. In fact, here below, only the upper part of the substrate 10 is subjected to the method.

Then (see FIG. 2), beneath the useful face 10A, a porous layer 11 is formed. This layer 11 is typically formed by anodization of the surface part of the substrate 10. As a variant it can be formed by deposition, by vapor spray deposition for example, of an additional layer which is directly porous or made to be at least partially porous by an appropriate treatment. Such a porous layer may thus be formed by the compacting of metal powders or by controlled deposition of porous silicon according to the technique described in Dougherty et al, "Microfabrication Using One-Step LPCVD Porous Polysilicon Films", Journal of Microelectromechanical systems, Vol 12, No. 4, August 2003 pp 418-424.

According to yet another variant that is not shown, the porous layer is itself formed by several layers having different levels of porosity.

The material of at least the portion designed to form the porous layer is advantageously made of silicon since it is a material for which the conditions of treatment to be applied in order to generate a given porosity in it are well known. However, as a variant, the constituent material of this portion may be:

more generally, a semiconductor material (InP, GaAs, Ge etc); indeed, the semiconductors can be made porous by anodization, a metal (aluminum, copper, steel, nickel, titanium etc) deposited by spraying or by compacting of a powder of these metals, an oxide, for example a spin-on glass sometimes abbreviated as SOG (this is an embodiment described especially in the document U.S. Pat. No. 6,919,106) or an oxide obtained by deposition and oxidation of a metal layer.

On this porous layer, a surface layer 12 is then made (see FIG. 3).

Then, a first multilayer substrate, referenced 20 in its totality, is prepared. This multilayer substrate comprises a porous layer buried at a non-zero distance beneath a free surface 20A.

This layer is advantageously formed by epitaxial growth according to the crystallographic characteristics of the constituent material of the porous layer, so that this layer 12 has a density far greater than that of the porous layer, in practice a density close to 100%, similar to that of the part of the substrate situated beneath the porous layer. As a variant, this layer 12 may consist of a surface layer of the porous layer which is recrystallized. As a variant, this layer 12 may be made by deposition of a polycrystalline material (for example silicon) and crystallization of this layer by an appropriate annealing operation.

This surface layer, situated between the porous layer and the free surface of the substrate of FIG. 3, is herein homogenous in being formed by a single layer. As a variant, this layer may be formed by several sub-layers, including especially a thermal oxide layer (constituting the free surface), or a clinging layer for the rest of the method.

This first substrate 20 is then subjected to an ion implantation (see FIG. 4) so as to embrittle the surface layer 12 at a zone 13 situated at a given depth denoted as d1; this implantation and the embrittlement that results therefrom is therefore obtained above the porous layer, at a non-zero distance from this layer, denoted as d2. The relative proportions between these distances d1 and d2 may be chosen according to need. The thickness d1 of the upper part 12A of the layer 12 situated above the embrittled zone 13 is herein greater than the thickness d2 of the lower part 12B situated beneath this embrittled zone 13 but above the porous layer 11; it can therefore be said that, in the example considered, the brittle zone demarcates, within the layer 12, a thin layer 12A and a thick layer 12B.

The implantation made for the formation of the embrittled zone 13 is in practice made with hydrogen or any other gas species, especially one of the rare gases or a combination of such species; this is advantageously a co-implantation of hydrogen and helium.

Preferably, the surface layer 12 has an overall thickness of at least 2 microns, advantageously with a thickness sufficiently greater than this value of 2 microns for the embrittled zone itself to be at least two microns from the porous layer.

At this stage, there is thus a first substrate available comprising two brittle zones of different natures, namely a brittle layer 11 situated in depth, that is porous, and an embrittled zone 13 that is closer to the surface and obtained by implantation.

It is possible, before or after the implantation step, to perform technological steps (see below with reference to the layer 17).

After a preparation, if necessary, of the free surface 20A, the first substrate 20 is joined to a second substrate 30 by bonding (see FIG. 5) using an addition of material (or preferably by molecular bonding). A thermal annealing operation can be applied if necessary to this unit 20+30 to consolidate the interface situated between these substrates.

Then, through the application of a mechanical stress, the lower part of the initial substrate 10 is detached from the rest of the structure of this FIG. 5, at the porous layer 11. The remaining part is shown schematically in FIG. 6.

While the porous layer 11 is actually formed by several porous layers of different porosity values, the detachment is in practice localized within the porous layer having the greatest porosity.

The mechanical stress is shown schematically in FIG. 5 by a pointed element. This mechanical stress can indeed be applied by an inserted blade acting on the porous layer. As a variant, the detachment of the lower part of the initial substrate 10 can be provoked by the application of a torque to each of the substrates 20 and 30 provided that the embrittled zone 13 is capable of withstanding this force (this is why it is preferable to apply the mechanical stress in a localized way, by means of a pointed element). The mechanical energy applied can also be provided by a high-pressure jet directed on the edge of the porous layer or in ultrasonic form.

The surface 14 thus bared can be subjected to polishing, for example mechanical/chemical polishing and then subjected to technological steps, i.e. steps coming into play in the manufacture of the micro-technological components such as mechanical and electronic components. The result of such steps is shown schematically in FIG. 7 by the formation of a layer 17 on the free surface 14 that has been bared as a consequence of the detachment. In order to avoid an untimely detachment at the brittle zone 13, the performance of these technological steps must be conducted at a moderate temperature, typically below 500° C. When the performance of these technological steps involves the application of mechanical stresses, it must also be seen to it that these stresses remain insufficient to prompt any detachment of this layer 13. In fact, the knowledge of the technological steps to be performed will enable those skilled in the art to identify the point up to which the zone 13 can be embrittled without any risk of detachment during these technological steps which are known in advance. Naturally, the technological steps can, as a variant, modify the layer 12B beneath its surface 14 without necessarily giving rise to the formation of an excess thickness.

The surface 14, with the layer 17 if any, is then attached to one face of a third substrate 40 (see FIG. 8). This joining is advantageously done by bonding, for example by an addition of material or even by molecular bonding, and conventional processing operations to this effect can be applied to favor this bonding. A thermal annealing process can furthermore be applied to consolidate this bonding (especially if it is a molecular bonding).

It is then possible to provoke the detachment of the thin layer 12A from the thick layer 12B at the embrittled zone 13 (see FIG. 9). This detachment is advantageously obtained by the application of a thermal treatment, complemented if necessary by the application of mechanical energy. This thermal treatment is chosen to be at a temperature that is low enough (in practice between 200° C. and 500° C.) to avoid any risk of impairing the result 17 of the technological steps. The lower the temperature, the more useful would it be to add mechanical energy. This mechanical energy can be applied not only locally, at the embrittled zone (as in the case of the detachment at the porous layer) but also comprehensively by the application of forces to the substrate 30 and 40, for example torque forces or antagonistic tensile forces.

It will be understood that the method that has just been described makes it possible to produce:
- a structure (40+17+12B) comprising a technological layer 17 which is buried beneath a thick layer 12B,
- a structure (30+12A) comprising a thin layer 12A on a support 30.

Each of these structures can then be subjected to subsequent technological steps which may or may not be independent while the residual part of the initial substrate 10 can be recycled for a new cycle as described here above. Naturally, if the thickness of the layer 12B allows it, it can be planned to use the structure 40+17+12B as an initial substrate instead of the substrate 10 for a new cycle similar to the one that has just been described.

This method enables the manipulation of relatively thick (>2 μm) layers 12 which are homogenous and are of good quality. It enables the technological steps to be carried out on both faces of the active layer thus made, in proposing two clearly distinct splitting modes (mechanical or thermal). The technological steps can then be applied to the step of FIG. 7 or after the step of FIG. 9, depending on the thermal and mechanical stresses that they induce.

According to this method, the second substrate 30 serves as a support and must enable a stiffening effect relatively to the layer 12A to propagate a line of splitting in the implanted zone without formation of blisters on the implanted surface. In fact, if this second layer 12A has a thickness sufficient to be a self-supporting surface, this second substrate can be omitted.

It will be understood that the substrates 30 and 40 must be capable of supporting a thermal treatment in the range of 200-500° C.

Advantageously, the detachment step of FIG. 5 may comprise, in addition to the application of mechanical stresses, a selective chemical etching of the porous layer.

As indicated here above, the detachment step of FIG. 9 may consist of a thermal processing operation, alone or in combination with the application of mechanical stresses.

It will be understood indeed that the difference in nature between the brittle layers 11 and 13 enables a well controlled activation of a detachment within each of these layers by an appropriate choice of the form of energy.

For example, if the technological steps of FIG. 7 comprise the formation of an insulator layer while the epitaxially grown layer 12 is made of monocrystalline silicon, the detachment described in FIG. 9 leads to obtaining an SOI (Silicon On Insulator) type structure 40+17+12B as well as a transfer of a thin layer 12A from the initial substrate 10 to the substrate 30.

Example 1

The initial substrate is a p+ doped Si substrate (100) (p=10 mΩ/cm). A dual layer of porous Si is formed by electrochemical anodization in two steps:

|  | [HF] (%) | Density of current (mA/cm$^2$) | Anodization duration (sec) |
| --- | --- | --- | --- |
| Step 1 | 25 | 5 | 60 |
| Step 2 | 12.5 | 40 | 60 |

A surface layer with low porosity (20% of pores) is obtained with a thickness of 1.2 µm along with a highly porous buried layer (70% of pores) with a thickness of 600 nm situated beneath the layer of low porosity.

The porous substrate Si is placed in an epitaxy frame under H2 at 1100° C. in order to rebuild the surface of the low-porosity layer. The growth of a layer of monocrystalline Si can then be done from the rebuilt surface, for example at 1100° C. under dichlorosilane. The epitaxial parameters (gas flow, duration) are chosen so that the thickness of the epitaxially grown layer is 15 µm.

The epitaxial layer is implanted with H+ ions in the following conditions: energy 15 keV, dose 5E16/cm$^2$. Advantageously, the implantation is done by submersion in hydrogen plasma.

The implanted porous wafer is bonded to a temporary support which may be an Si wafer, using a low-cost bonder (ceramic, metal paste, high-temperature polymer etc). The splitting is brought about at the highly porous layer by the application of ultrasound in the 15-400 kHz, 200-6000 W range. The implanted epitaxially grown layer is thus transferred to the temporary support. It is possible to perform technological steps for the manufacture of solar cells such as for example metallization by screen printing (involving high mechanical stresses). The processed surface is then bonded to a final low-cost support (ceramic, high-temperature plastic, steel etc) using a low-cost bonder, and the splitting is provoked at the implanted zone by annealing at 800° C. The active layer thus transferred can then be treated. For example it is possible to perform a surface texturing and deposit a reflection-proof layer so as to make a solar cell. The initial substrate and the temporary substrate can be recycled.

Example 2

The initial substrate is a p+ doped Si substrate (100) (p=10 mΩ/cm). A porous layer of Si is formed by electrochemical anodization according to the following protocol:

| [HF] (%) | Density of current (mA/cm$^2$) | Duration of anodization (sec) |
| --- | --- | --- |
| 25 | 30 | 85 |

Thus a layer of average porosity (40% of pores) with a thickness of 3 µm is obtained. The porous substrate Si is placed in an epitaxy frame under H$_2$ at 1100° C. in order to rebuild the surface of the low-porosity layer. A layer of monocrystalline Si can then be frown from the reconstructed surface, for example at 1100° C. under dichlorosilane. The thickness of the epitaxiated Si layer is chosen to be of the order of 3 µm. The epitaxial layer is implanted with H$^+$ ions under the following conditions: energy 150 keV, dosage 5E16/cm$^2$. The implanted porous wafer is bonded to an Si wafer covered with a thermal oxide by molecular adhesion. The splitting is provoked at the highly porous layer by the insertion of a blade at the bonding interface. The implanted epitaxiated layer is thus transferred to the Si wafer if oxidized. It is possible to perform technological steps involving high mechanical stresses (etching, deposition and other stresses). The processed layer is then bonded to a final support which may be an Si wafer, by molecular bonding via a planarized oxide. The splitting is provoked at the implanted zone by annealing at 500° C. The epitaxiated layer is then separated into two layers of a thickness of ~1.5 µm: we obtain firstly a processed layer transferred to an Si substrate and secondly a classic SOI substrate. Each transferred layer can then be processed. For example, it is possible to perform classic steps for manufacturing microelectronic components (doping, deposition etc). The initial substrate can be recycled.

It will be understood that, in teaching the direct implantation in a substrate containing the porous layer, the invention enables the manipulation of a homogenous and relatively thick layer and the performance of technological steps on both faces of this layer. The active layer is defined between the porous layer and the implanted layer, leaving wide latitude as regards the thickness of this layer. This thickness can easily be greater than 1 micron or even 10 microns or even more (without any resorting to very high implantation energy values which could prove to be costly).

The invention claimed is:

1. A method for transferring at least one micro-technological layer, said method comprising:
    preparing a first substrate having a porous layer buried beneath a useful surface at a non-zero distance,
    forming, by ion implantation, an embrittled zone between the porous layer and the useful surface,
    bonding the first substrate to a first supporting substrate,
    causing a detachment at the porous layer by application of a mechanical stress so as to obtain:
    a remnant of the first substrate, and
    a detached layer joined to the first supporting substrate and having a bared surface,
    performing technological steps on the bared surface of the detached layer,
    bonding the detached layer, by the surface to which the technological steps had been applied, to a second supporting substrate,
    causing a detachment, at the embrittled zone, by application of heat treatment so as to obtain:
    a remnant of the detached layer that is joined to the second supporting substrate, and
    a remnant of the detached layer that is joined to the first supporting substrate.

2. The method of claim 1, wherein the embrittled zone is at a first distance from the useful surface of the first substrate, the first distance being greater than a second distance between the embrittled zone and the porous layer.

3. The method of claim 1, wherein the first substrate is prepared by anodization of an initial substrate so as to make the initial substrate porous on a surface thereof, and then by epitaxial growth of a dense layer from the porous layer.

4. The method of claim 1, wherein the porous layer is formed by at least two porous sub-layers having different porosity values.

5. The method of claim 4, wherein the porous sub-layer with a lower porosity value is closer to the useful surface than the other porous sub-layer.

6. The method of claim 1, wherein the porous layer has a thickness of at least one micron.

7. The method of claim 1, wherein the layer between the porous layer and the useful surface is made of monocrystalline material.

8. The method of claim 1, wherein the layer between the porous layer and the useful surface has a thickness at least equal to two microns.

9. The method of claim 1, wherein the embrittled zone is formed by implantation of at least one gas species.

10. The method of claim 9, wherein at least hydrogen is implanted.

11. The method of claim 9, wherein at least helium is implanted.

12. The method of claim 1, wherein the detachment is provoked at the porous layer by localized application of mechanical energy.

13. The method of claim 1, wherein the technological steps comprise formation of at least one part of a micro-technological component.

14. The method of claim 1, wherein the technological steps comprise formation of at least one insulator layer.

15. The method of claim 1, wherein detachment is provoked at the embrittled zone by application of heat treatment combined with application of mechanical energy.

16. The method of claim 1, wherein detachment is provoked at the embrittled zone by application of heat treatment without application of mechanical energy.

17. The method of claim 1, wherein the remnant of the first substrate is used as a first substrate during a new cycle for implementing the method.

18. The method of claim 1, wherein technological steps are applied to each of the remnants of the detached layer that are separated during the detachment at the embrittled zone.

19. The method of claim 2, wherein technological steps are applied to each of the remnants of the detached layer that are separated during the detachment at the embrittled zone.

20. The method of claim 3, wherein technological steps are applied to each of the remnants of the detached layer that are separated during the detachment at the embrittled zone.

* * * * *